United States Patent [19]
Lee

[11] Patent Number: 6,013,545
[45] Date of Patent: Jan. 11, 2000

[54] METHOD OF MANUFACTURING HIGH-VOLTAGE METAL-OXIDE-SEMICONDUCTOR DEVICE

[75] Inventor: Jia-Sheng Lee, Hsinchu, Taiwan

[73] Assignee: United Microelectronics Corp., Taipei, Taiwan

[21] Appl. No.: 09/111,136

[22] Filed: Jul. 7, 1998

[30] Foreign Application Priority Data

Jun. 3, 1998 [TW] Taiwan ................................. 87108700

[51] Int. Cl.$^7$ ............................................. H01L 21/8238
[52] U.S. Cl. ........................... 438/217; 438/224; 438/232
[58] Field of Search .................................... 438/217, 221, 438/223, 224, 231, 232, 296

[56] References Cited

U.S. PATENT DOCUMENTS

| | | | |
|---|---|---|---|
| 4,729,964 | 3/1988 | Natsuaki et al. ......................... | 438/224 |
| 5,798,552 | 8/1998 | Alavi et al. .............................. | 438/231 |
| 5,937,287 | 8/1999 | Gonzalez ................................. | 438/224 |

*Primary Examiner*—Chandra Chaudhari
*Attorney, Agent, or Firm*—Thomas, Kayden, Horstemeyer & Risley

[57] ABSTRACT

A method of manufacturing a high-voltage metal-oxide-semiconductor device that uses trenches instead of a field oxide layer as an isolating structure, and employs a vertical layout rather than a horizontal layout so that more area is available for forming devices and drift region is lengthened as well. Therefore, this invention is capable of fabricating a CMOS transistor even at the sub-micron level, and hence is able to increase the level of circuit integration for a given a wafer. Furthermore, localized atomic oxygen implant and epitaxial growth techniques are used in this invention. Consequently, an etching stop layer can be precisely established in the silicon substrate within an active area. Due to the presence of an oxide layer underneath the epitaxial layer, the oxide layer can serve as an etching stop layer when the active area of a silicon substrate is patterned. Moreover, when the dopants in the lightly doped regions are driven into the substrate by heating, some of the dopants in the doped region can be driven into the region underneath the MOS channel as well. Other regions are blocked by the oxide layer, thereby ensuring purity of ions outside the lightly doped region. Hence, the operating current of the device can be increased.

52 Claims, 11 Drawing Sheets

METHOD OF MANUFACTURING HIGH-VOLTAGE METAL-OXIDE-SEMICONDUCTOR DEVICE

CROSS-REFERENCE TO RELATED APPLICATION

This application claims the priority benefit of Taiwan application Ser. No. 87108700, filed Jun. 3, 1998, the full disclosure of which is incorporated herein by reference.

BACKGROUND OF THE INVENTION

1. Field of Invention

The present invention relates to a method of manufacturing a metal-oxide-semiconductor (MOS). More particularly, the present invention relates to a method of manufacturing high-voltage complementary metal-oxide-semiconductor (CMOS).

2. Description of Related Art

As devices are miniaturized, channel length is also shortened, which leads to a higher operation speed. However, short device channels are accompanied by problems referred to as the short channel effect. In general, an electric field within a transistor channel is governed by the relationship field=voltage/channel length. Therefore, if the applied voltage to a transistor remains unchanged while its channel length is shortened, electrons will have higher energies caused by accelerating in a higher electric field. Consequently, the likelihood of an electrical breakdown is greatly increased.

Generally, a high-voltage MOS device is capable of functioning normally despite the application of a high voltage because an isolating layer and a drift region underneath the isolating layer serves to increase the distance of separation between the source/drain terminal and the gate terminal of the MOS device.

Figure 1A:
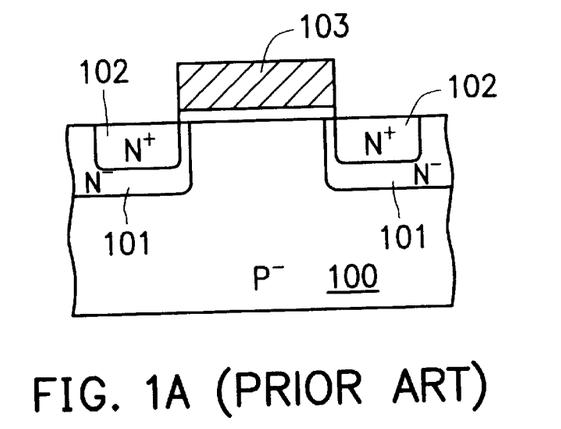
FIGS. 1A, 1B and 1C are cross-sectional views showing the structures of conventional high-voltage MOS devices.
Figure 1B:
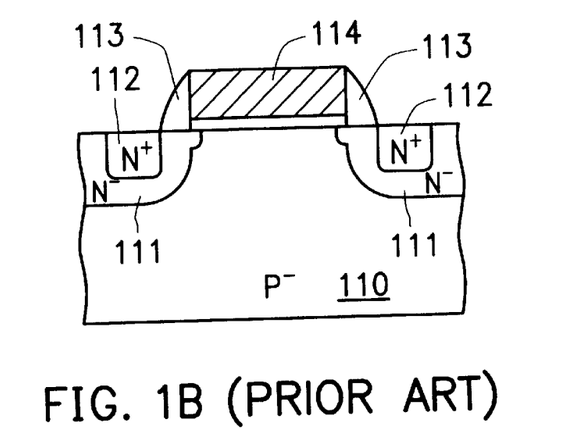
Figure 1C:
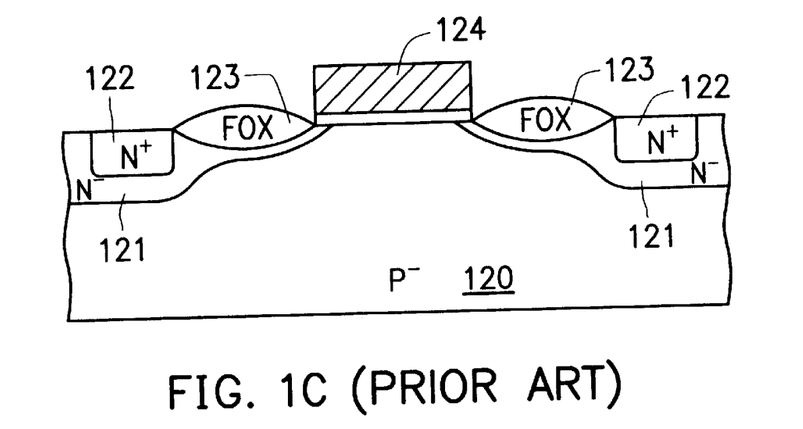

FIGS. 1A, 1B and 1C are cross-sectional views showing the structures of conventional high-voltage MOS devices.

In FIG. 1A, the high-voltage MOS device has a P$^-$ substrate 100, N$^-$ doped regions 101, N$^+$ doped regions 102, and a gate layer 103. The N$^+$ doped region 102 is the source/drain region, and the N$^-$ doped region 101 serves to increase the distance of separation between the source/drain terminal and the gate terminal.

In FIG. 1B, the high-voltage MOS device has a P$^-$ substrate 110, N$^-$ doped regions 111, N$^+$ doped regions 112, spacers 113 and a gate layer 114. The N$^+$ doped region 112 is the source/drain region, and the N$^-$ doped region 111 and the spacer 113 serve to increase the distance of separation between the source/drain terminal and the gate terminal.

In FIG. 1C, the high-voltage MOS device has a P$^-$ substrate 120, N$^-$ doped regions 121, N$^+$ doped regions 122, field oxide (FOX) layer 123 and a gate layer 124. The N$^+$ doped region 122 is the source/drain region, and the N$^-$ doped region 121 and the field oxide layer 123 serve to increase the distance of separation between the source/drain terminal and the gate terminal.

However, the high-voltage MOS devices shown in FIGS. 1A, 1B and 1C all have planar structures. These devices must be layout laterally and hence sufficient space must be provided to accommodate the required isolation layer. With this type of design, surface area needed to form these devices is increased and the critical dimensions are difficult to reduce. Ultimately, the level of integration of these devices is affected. In other words, it is difficult to shorten the channel length of these conventional high-voltage MOS devices, thus making the development of sub-micron high-voltage MOS devices impossible.

In light of the foregoing, there is a need to provide an improved method of manufacturing high-voltage MOS devices.

SUMMARY OF THE INVENTION

Accordingly, the present invention provides a method of manufacturing high-voltage MOS devices that uses a vertical type of structure to replace the conventional lateral type of structure, thereby saving a great amount of device area.

In another aspect, this invention is to provide a method of manufacturing high-voltage CMOS devices capable of fabricating sub-micron high-voltage MOS devices so that the level of integration for a given wafer can be increased.

In yet another aspect, this invention is to provide a method of manufacturing high-voltage CMOS devices that utilize a punchthrough implantation method. Punchthrough implantation implants ions into the region below the channel of the MOS without implanting into the regions below the N$^-$ or the P$^-$ doped areas. Hence, junction breakdown voltage is greatly increased while punchthrough is avoided.

In one further aspect, this invention is to provide a method of manufacturing high-voltage CMOS devices that use localized atomic oxygen implantation techniques together with an epitaxial layer for precisely controlling the etching end point in the active area of the silicon substrate.

To achieve these and other advantages and in accordance with the purpose of the invention, as embodied and broadly described herein, the invention provides a method of manufacturing high-voltage MOS devices. The method comprises the steps of first providing a semiconductor substrate, and then sequentially forming a first oxide layer and a first silicon nitride layer over the substrate. Next, a portion of the first silicon nitride layer is etched to form isolating insulators, and then an N-well and a P-well are formed between the patterned first silicon nitride isolators. Thereafter, a localized oxygen plasma implant is carried out to implant atomic oxygen into a portion of the N-well and P-well. Subsequently, an annealing and oxidation operation is carried out to form a second oxide layer, wherein the second oxide layer is buried inside the N-well and the P-well. After that, the first silicon nitride layer and the first oxide layer are removed, and then an epitaxial silicon layer is formed over the semiconductor substrate. Next, a third oxide layer and a second silicon nitride layer are sequentially formed over the epitaxial silicon layer. Thereafter, a portion of the second silicon nitride layer, the third oxide layer, the N-well and the P-well are etched away to form a trench between the N-well and the P-well. Subsequently, a fourth oxide layer is formed over the trench surface, and then a fifth oxide layer is deposited to fill the trench. Then, the second silicon nitride layer and the third oxide layer are removed. Thereafter, a sixth oxide layer is formed over the substrate. Next, a first P$^-$ region is formed in the N-well while a first N$^-$ region is formed in the P-well. Depth of the first P$^-$ region and depth of the first N$^-$ region are deeper than the second oxide layer. Subsequently, the active area is defined by etching away a portion of the sixth oxide layer. Thereafter, a portion of the P$^+$ region and the first P$^-$ region in the N-well are sequentially etched using the second oxide layer as an etching stop layer to form a first opening. At the same time, a portion of the N$^+$ region and the first N$^-$ region in the P-well are sequentially etched using the second oxide layer as an etching stop layer to form a second opening. Next, the sixth oxide layer and the second oxide layer are removed, and then a seventh oxide layer is formed over the semiconductor substrate. Subsequently, a PMOS punchthrough implant and a threshold voltage implant are carried out with respect to the N-well. Similarly, an NMOS punchthrough implant and a threshold voltage implant are carried out with respect to the P-well. Thereafter, the seventh oxide layer is removed, and then a gate oxide layer is formed over the substrate. Next, a first conductive layer is formed over the gate oxide layer at the bottom of the first opening. At the same time, a second conductive layer is formed over the gate oxide layer at the bottom of the second opening. Finally, a low concentration of P-type impurities is implanted into the N-well region to form a second P$^-$ region beneath the first opening. Similarly, a low concentration of N-type impurities is implanted into the P-well region forming a second N$^-$ region beneath the second opening.

According to one preferred embodiment of this invention, a photolithographic operation is used to form a photomask, and then the photomask is used as an etching mask for patterning the first silicon nitride layer into isolators.

According to one preferred embodiment of this invention, the step of forming the N-well and the P-well further includes implanting N-type impurities into the intended N-well region and implanting P-type impurities into the intended P-well region, and then driving-in the implanted impurities by heating.

According to one preferred embodiment of this invention, a photolithographic operation is used to form a photomask for patterning the active area, and then the photomask is used as a mask for implanting oxygen ions into the substrate in a localized oxygen ion implant.

According to one preferred embodiment of this invention, the step of forming an epitaxial silicon layer above the N-well region and P-well region of the semiconductor substrate includes using epitaxial growth techniques.

According to one preferred embodiment of this invention, the same photomask used for patterning the isolating insulators is used as a mask for dry etching a portion of the second silicon nitride layer, the third oxide layer, the N-well and the P well to form a trench between the N-well and the P-well.

According to one preferred embodiment of this invention, a high-density plasma chemical vapor deposition method is used to deposit the fifth oxide layer.

According to one preferred embodiment of this invention, the step of forming the first P$^-$ region and the first N$^-$ region further includes implanting a low concentration of P-type dopants into the N-well and implanting a low concentration of N-type dopants into the P-well, and then driving-in the dopants by heating. Hence, depth of implanted dopants is at a level lower than the second oxide layer, thereby forming a first P$^-$ region in the N-well and a first N$^-$ region in the P-well. The first P$^-$ region is a lightly doped P-type region, and the first N$^-$ region is a lightly doped N-type region.

According to one preferred embodiment of this invention, the step of forming the P$^+$ region and the N$^-$ region further includes implanting a high concentration of P-type dopants into the N-well and implanting a high concentration of N-type dopants into the P-well. The dopants are then driven in by heating to form a P$^+$ region in the N-well and an N$^+$ region in the P-well. The P$^+$ region is a heavily doped P-type region, and the N$^+$ region is a heavily doped N-type region.

According to one preferred embodiment of this invention, the photomask for carrying out the localized oxygen ion implant is also used as a mask for patterning the active area through etching away a portion of the sixth oxide layer.

According to one preferred embodiment of this invention, the mask used for patterning the active area through etching away a portion of the sixth oxide layer is also used as a mask for forming the first opening, and the second opening.

According to one preferred embodiment of this invention, P$^{31}$ and BF$_2$ are used for carrying out the respective PMOS punchthrough implant and threshold voltage implant of the N-well, and B$^{11}$ and BF$_2$ are used for carrying out the NMOS punchthrough implant and threshold voltage implant of the P-well.

According to one preferred embodiment of this invention, the first conductive layer and the second conductive layer include a doped polysilicon layer. The step of forming the first conductive layer and the second conductive layer includes depositing a polysilicon layer over the gate oxide layer, and then doping the polysilicon layer. Thereafter, the doped polysilicon layer is patterned to form a first conductive layer in the first opening and a second conductive layer in the second opening. The first conductive layer only partially covers the bottom part of the first opening. Similarly, the second conductive layer only partially covers the bottom part of the second opening.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2A:
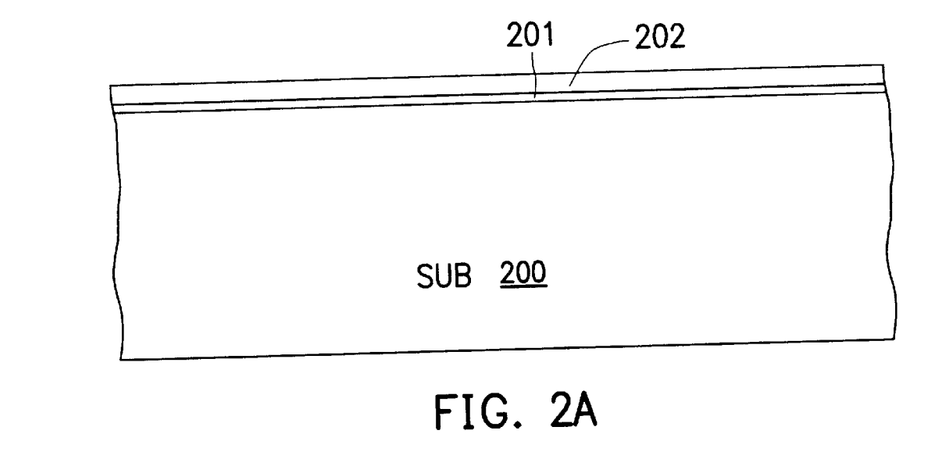
FIGS. 2A through 2S are cross-sectional views showing the progression of manufacturing steps in fabricating a high-voltage CMOS device according to one preferred embodiment of this invention.
Figure 2B:
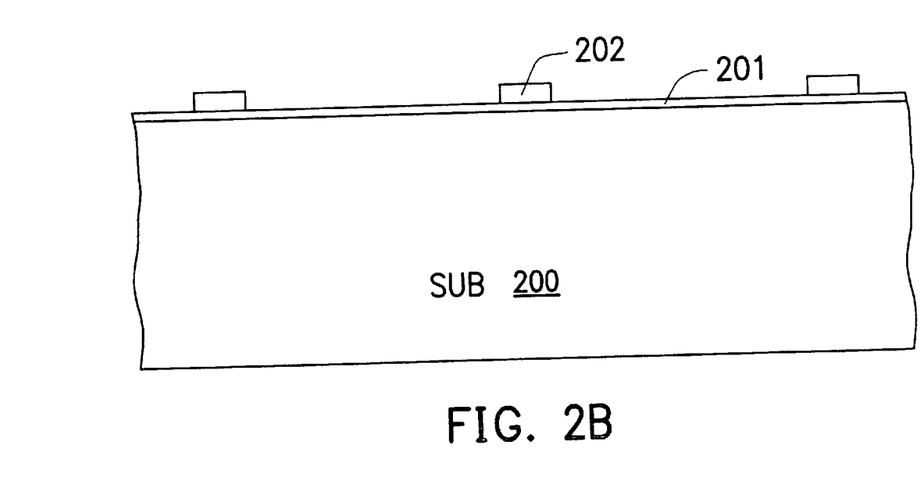
Figure 2C:
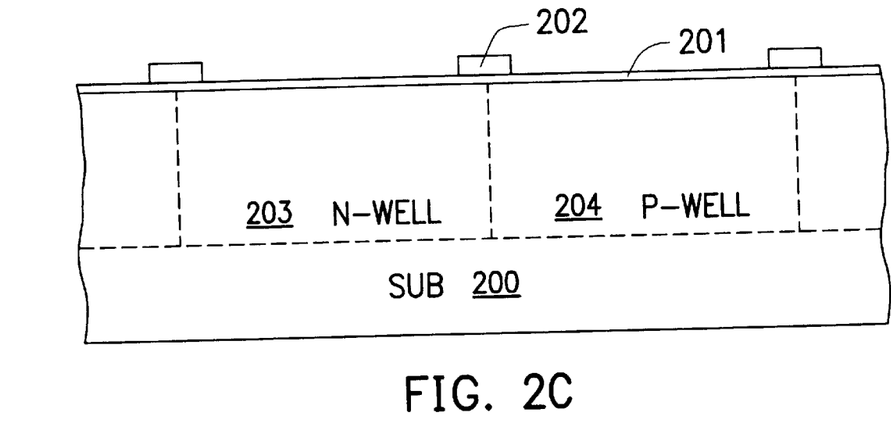
Figure 2D:
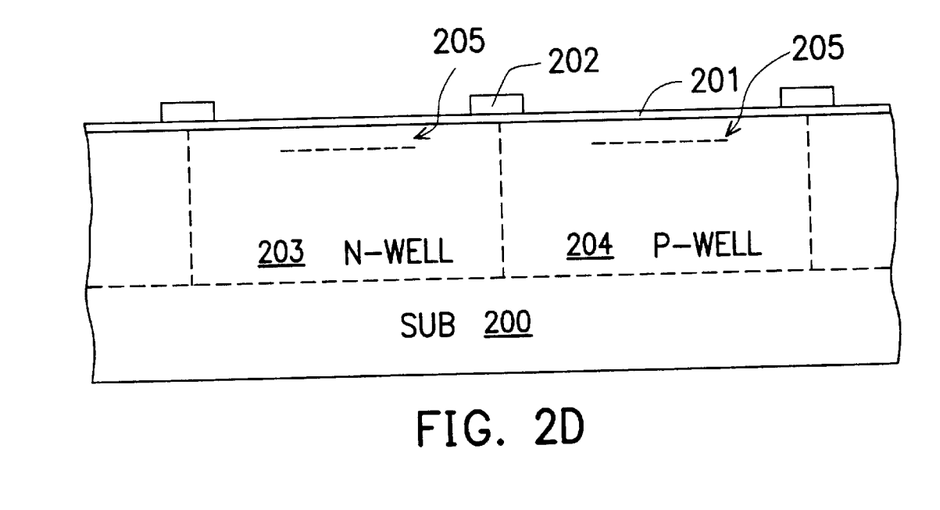
Figure 2E:
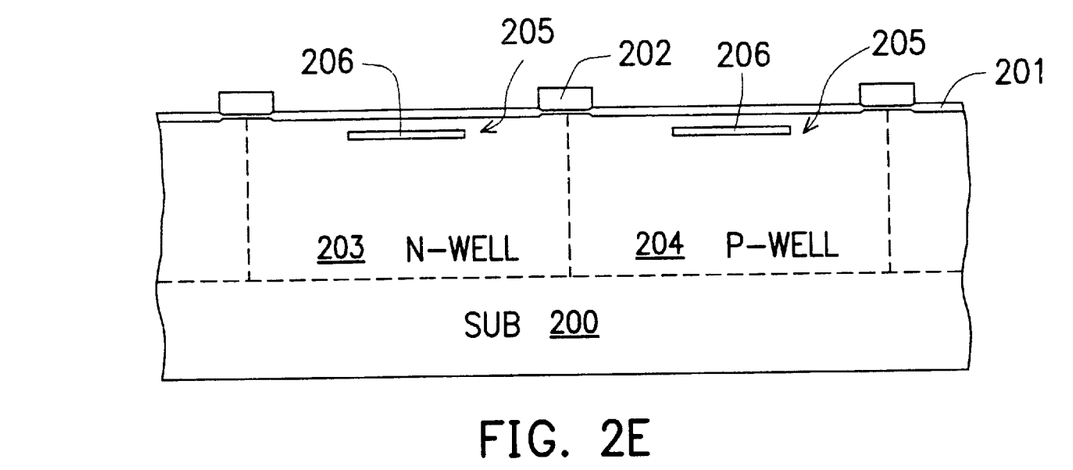
Figure 2F:
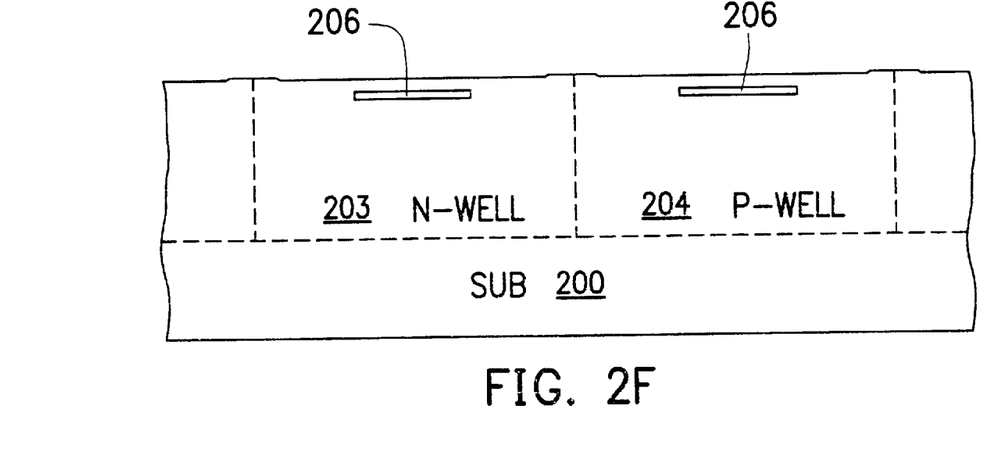
Figure 2G:
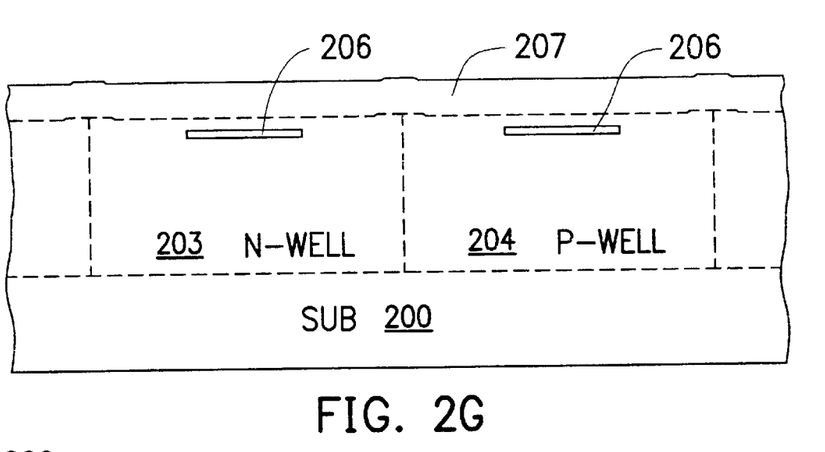
Figure 2H:
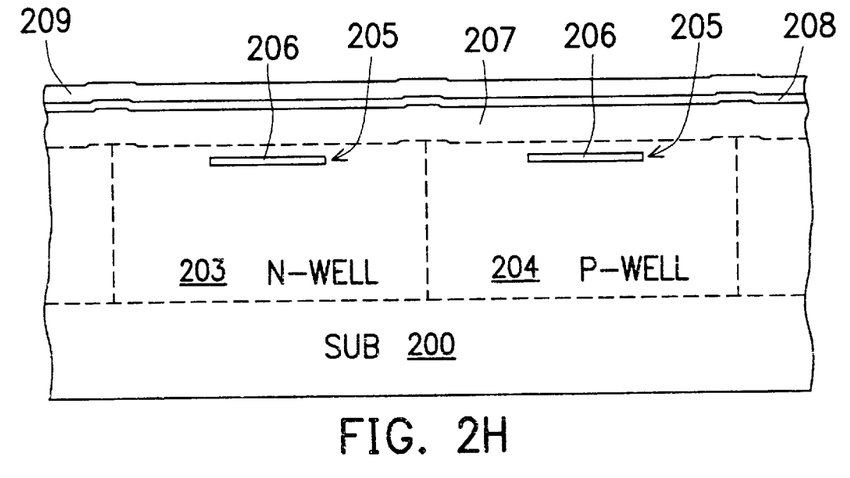
Figure 2I:
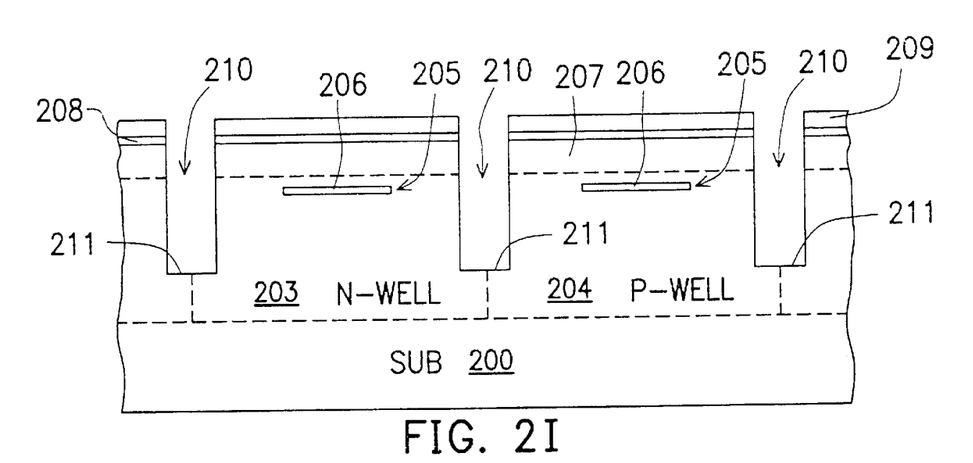
Figure 2J:
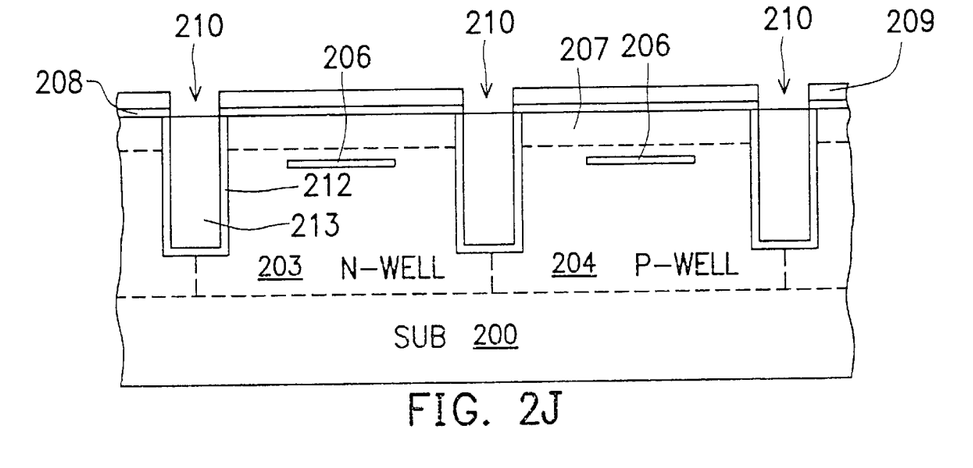
Figure 2K:
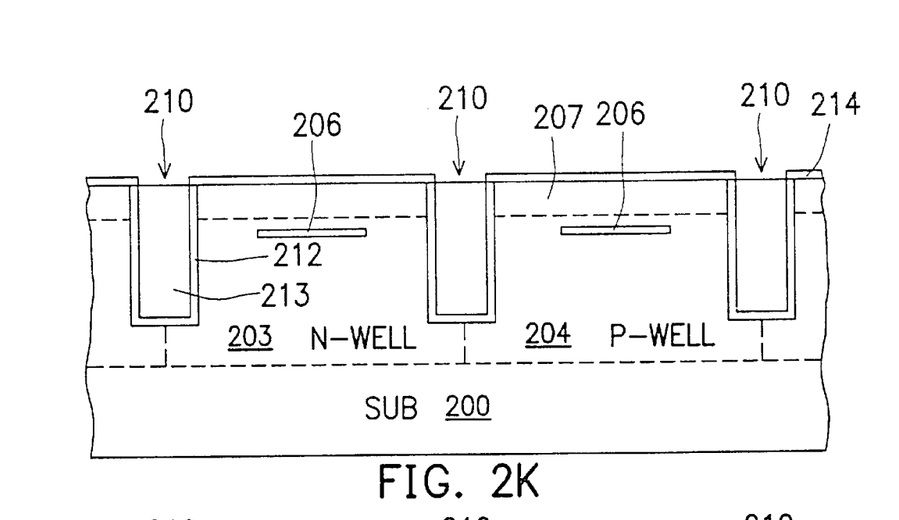
Figure 2L:
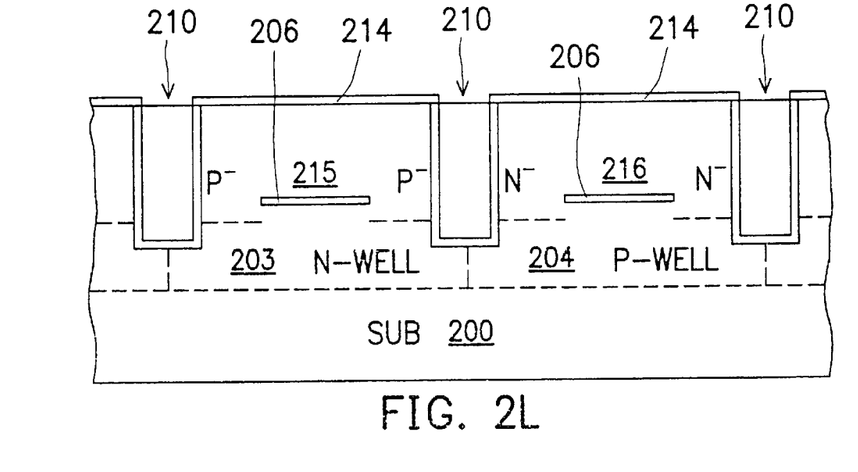
Figure 2M:
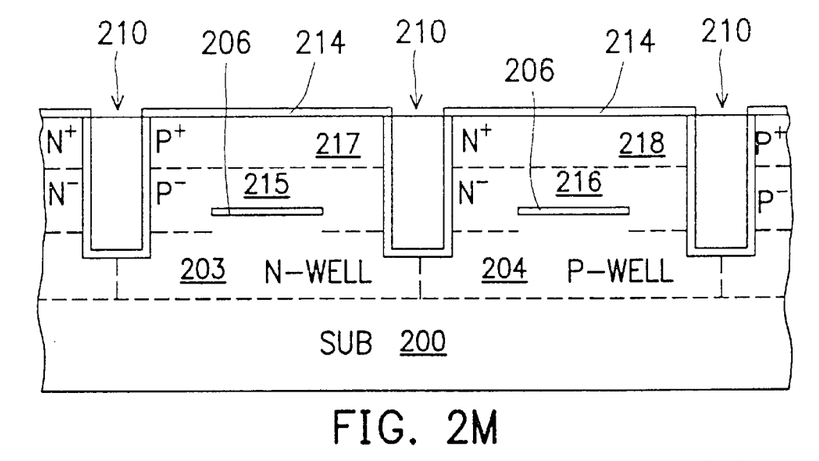
Figure 2N:
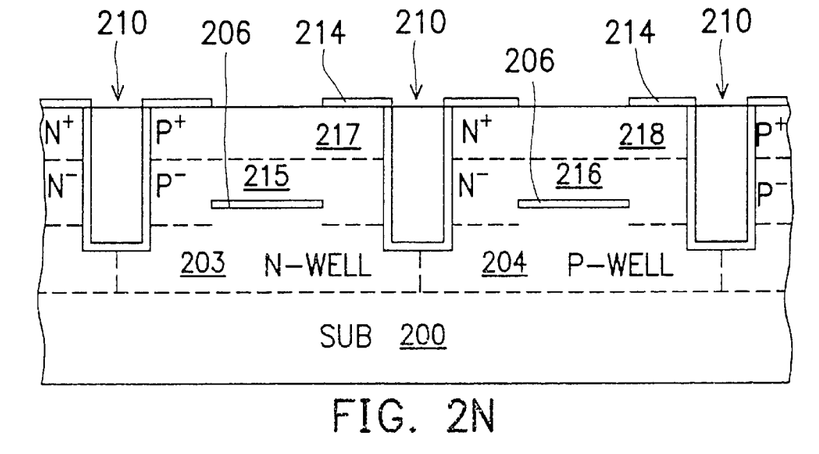
Figure 2O:
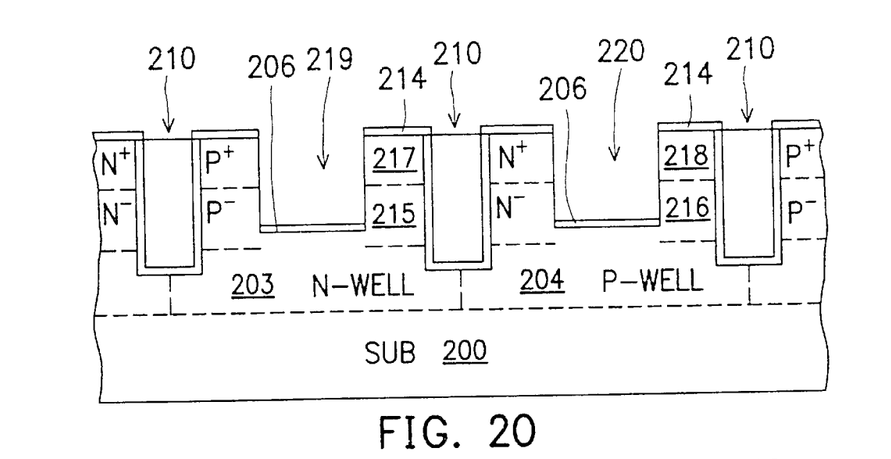
Figure 2P:
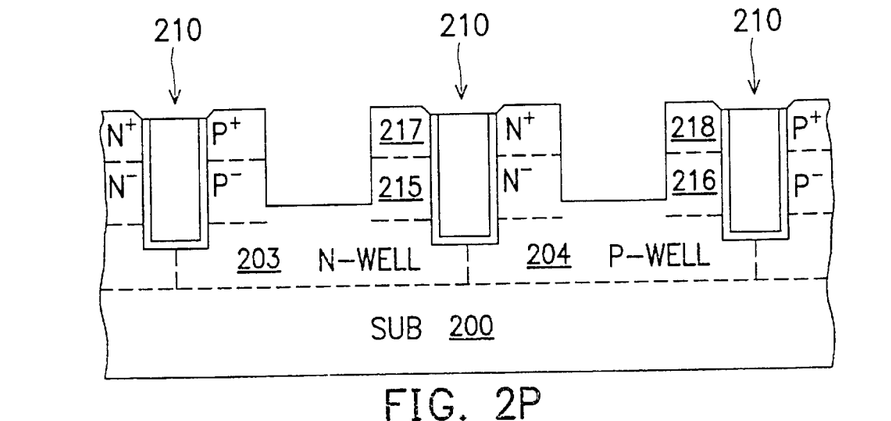
Figure 2Q:
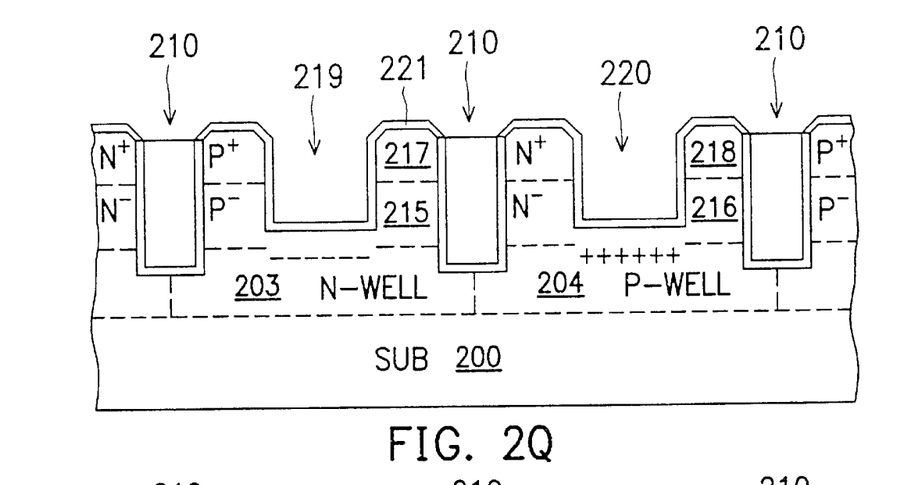
Figure 2R:
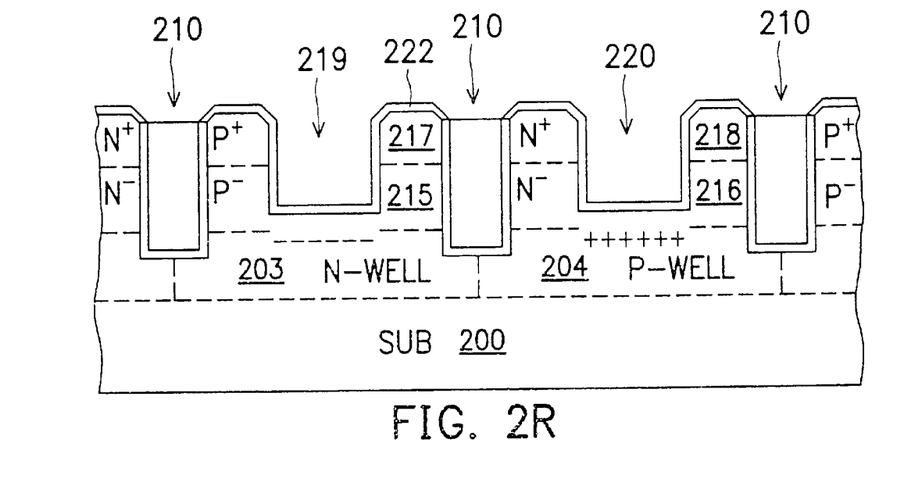
Figure 2S:
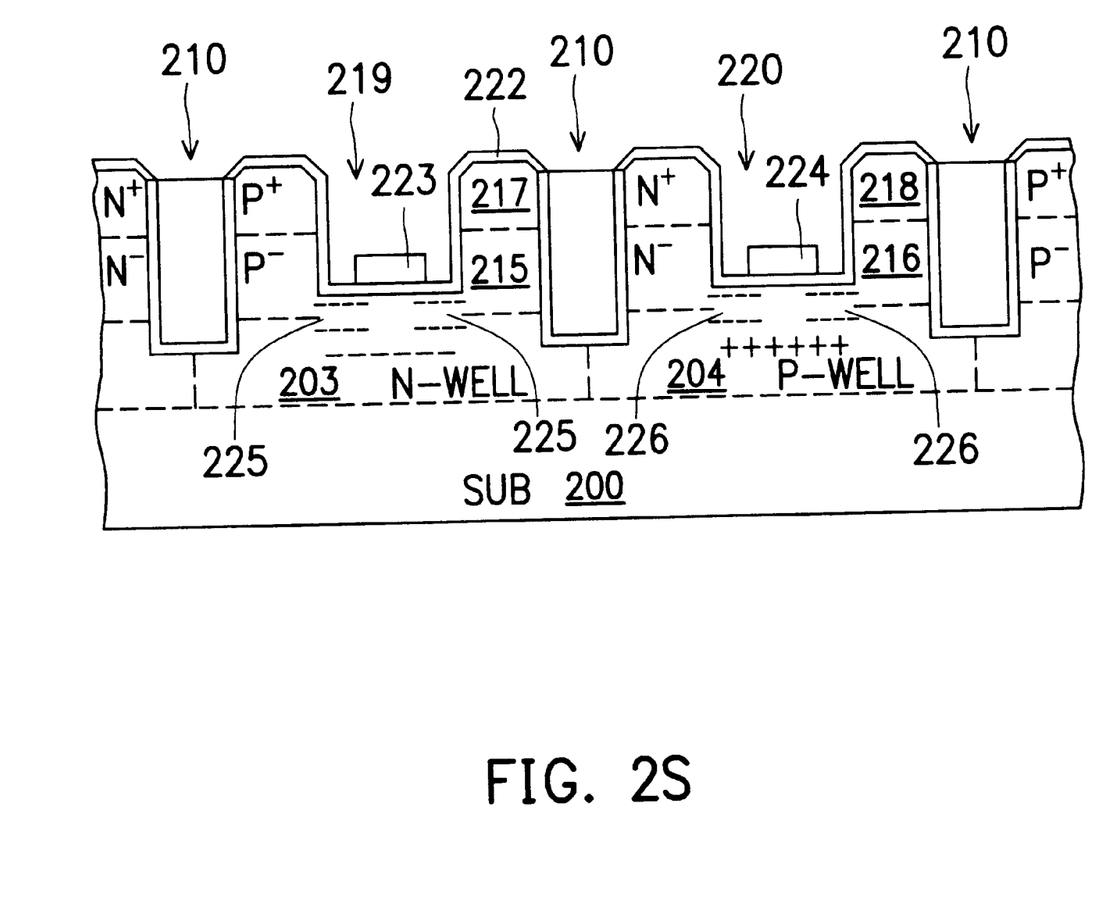

FIGS. 2A through 2S are cross-sectional views showing the progression of manufacturing steps in fabricating a high-voltage CMOS device according to one preferred embodiment of this invention.

First, as shown in FIG. 2A, a semiconductor substrate 200, for example, a P-type substrate is provided. Then, a first oxide layer 201 and a first silicon nitride layer 202 are sequentially formed over the substrate 200. The first oxide layer 201 often known as a pad oxide layer is formed using a thermal oxidation method. The first silicon nitride layer 202 is formed using, for example, a chemical vapor deposition method.

Next, as shown in FIG. 2B, a portion of the first silicon nitride layer 202 is etched to form a pattern of isolating insulators. For example, a photomask (not shown) for creating a pattern of isolating insulators is first formed using a photolithographic operation, and then the photomask is used as a mask for etching the first silicon nitride layer 202.

Next, as shown in FIG. 2C, an N-well 203 and a P-well 204 are formed between the isolating insulators created after patterning the silicon nitride layer 202. For example, the N-well is formed by implanting N-type dopants into the intended N-well 203 region, and the P-well is formed by implanting P-type dopants into the intended P-well 204 region. Subsequently, the implanted dopants are driven in by heating to form the N-well 203 and the P-well 204.

Next, as shown in FIGS. 2D and 2E, a localized oxygen ion implant is performed, implanting atomic oxygen into the location labeled 205. Thereafter, the substrate is annealed and oxidized, during which a second oxide layer 206 forms inside each N-well 203 and P-well 204, somewhere around location 205. The second oxide layer 206 is buried deep inside the N-well 203 region and the P-well 204 region. The second oxide layer 206 can be formed, for example, by first producing a photomask (not shown) using a photolithographic operation, and then performing the localized oxygen ion implant using the photomask as a mask.

Next, as shown in FIG. 2F, the first silicon nitride layer 202 and the first oxide layer 201 are removed. For example, a dry etching method or a wet etching method can be used to remove the first silicon nitride layer 202 and the first oxide layer 201.

Next, as shown in FIG. 2G, an epitaxial silicon layer 207 is formed over the semiconductor substrate 200. For example, an epitaxial layer 207 is formed over the substrate 200 above the N-well 203 and the P-well 204 using epitaxial growth techniques.

Next, as shown in FIG. 2H, a third oxide layer 208 and a second silicon nitride layer 209 are sequentially formed over the epitaxial silicon layer 207. The third oxide layer 208, also known as a pad oxide layer, can be formed using a thermal oxidation method. The second silicon nitride layer 209 can be formed using, for example, a chemical vapor deposition method.

Next, as shown in FIG. 2I, a portion of the second silicon nitride layer 209, the third oxide layer 208, the N-well 203 and the P-well 204 are removed to form a trench 210 between the N-well 203 and the P-well 204. The bottom part 211 of the trench is at a level lower than the second oxide layer 206 positioned in location 205. For example, the same photomask used for patterning out isolating insulators in the first silicon nitride layer 202 is again used as a mask for dry-etching a portion of the second silicon nitride layer 209, the third oxide layer 208, the N-well 203 and the P-well 204 to form the trench 21 0 between the N-well 203 and the P-well 204.

Next, as shown in FIG. 2J, an oxidation method is used to form a fourth oxide layer 212 over the trench 210 surface, and then a fifth oxide layer 213 is deposited into the trench 210 using, for example, a high-density plasma chemical vapor deposition (HDPCVD).

Next, as shown in FIG. 2K, the second silicon nitride layer 209 and the third oxide layer 208 are removed. Thereafter, a thermal oxidation method is used to form a sixth oxide layer over the substrate 200. The sixth oxide layer 214 also known as a pad oxide layer.

Next, as shown in FIG. 2L, a first P⁻ region 215 is formed in the N-well region 203 and a first N⁻ region 216 is formed in the P-well region 204. The first P⁻ region 215 is a lightly doped P-type region, and the first N⁻ region 216 is a lightly doped N-type region. For example, the first P⁻ region 215 is formed by implanting a low concentration of P-type dopants into the N-well 203 and the first N⁻ region 216 is formed by implanting a low concentration of N-type dopants into the P-well 204. Thereafter, the dopants are driven-in by heating such that the dopants are pushed to a level deeper than the second oxide layer 206. Due to the presence of the second oxide layer 206, the implanted and drive-in dopants will not get underneath the second oxide layer 206 at this stage.

Next, as shown in FIG. 2M, a P⁺ region 217 is formed in the N-well region 203 and a N⁺ region 218 is formed in the P-well region 204. The P⁺ region 217 is a heavily doped P-type region, and the N⁺ region 218 is a heavily doped N-type region. For example, the P⁺ region 217 is formed by implanting a high concentration of P-type dopants into the N-well 203 and the N⁺ region 218 is formed by implanting a high concentration of N-type dopants into the P-well 204. Thereafter, the dopants are driven-in by heating such that the dopants are pushed to a level shallower than the second oxide layer 206. Note from FIG. 2M that distance from the lower junction to the upper surface of the substrate 200 decreases in the order of N-well 203, the first P⁻ region 215 and the P⁺ region 217. Similarly, distance from the lower junction to the substrate 200 surface decreases in the order of P-well 204, the first N⁻ region 216 and the N⁺ region 218. The PW region 217 functions as a PMOS source/drain region, whereas the N⁺ region 218 functions as an NMOS source/drain region.

Next, as shown in FIG. 2N, an active area is defined by etching away a portion of the sixth oxide layer 214. For example, the same photomask used to perform the localized atomic oxygen implantation is used as a mask for etching away a portion of the sixth oxide layer 210.

Next, as shown in FIG. 2O, a portion of the P⁺ region 217 and a portion of the first P⁻ region 215 in the N-well 203 are etched away using the second oxide layer 206 as an etching stop to form a first opening 219. Similarly, a portion of the N⁺ region 218 and a portion of the first N⁻ region 216 in the P-well 204 are etched away using the second oxide layer 206 as an etching stop to form a second opening 220. For example, the same photomask used in defining the active area (refer to FIG. 2N) is used as a mask to carry out the above etching operation.

Next, as shown in FIG. 2P, the sixth oxide layer 214 and the second oxide layer 206 are removed using, for example, a dry etching method.

Next, as shown in FIG. 2Q, a seventh oxide layer 221 is formed over the semiconductor substrate 200. Thereafter, a PMOS punchthrough implant and a threshold voltage implant using, for example, $P^{31}$ and $BF_2$, respectively, are carried out with respect to the N-well 203, and an NMOS punchthrough implant and a threshold voltage implant using, for example, $B^{11}$ and $BF_2$ respectively, are carried out with respect to the P-well 204.

Next, as shown in FIG. 2R, the seventh oxide layer 221 is removed. Thereafter, a gate oxide layer 222 is formed over the substrate 200. For example, a chemical vapor deposition method or a thermal oxidation method is used to form the gate oxide layer 222.

Finally, as shown in FIG. 2S, a first conductive layer 223 is formed over the gate oxide layer 222 at the bottom of the first opening 219, and a second conductive layer 224 is formed over the gate oxide layer 222 at the bottom of the second opening 220. Subsequently, the N-well region 203 are implanted using a low concentration of P-type dopants, thereby forming a second P⁻ region 225 in the N-well 203 region underneath the first opening 219. Similarly, the P-well region 204 are implanted using a low concentration of N-type dopants, thereby forming a second N⁻ region 226 in the P-well 204 region underneath the second opening 220. The second P⁻ region 225 and the second N⁻ region 226 can be formed, for example, by forming a polysilicon layer (not shown) over the gate oxide layer 222, and then doping the polysilicon layer (for example, using $POCl_3$ to carry out the doping operation) to increase its electrical conductivity. Thereafter, the doped polysilicon layer is patterned to form the first conductive layer 223 in the first opening 219 and the second conductive layer 224 in the second opening 220. The first conductive layer 223 and the gate oxide layer 222 together form a PMOS gate, while the second conductive layer 224 and the gate oxide layer 222 together form an NMOS gate. The first conductive layer 223 only partially covers the bottom of the first opening 219. Similarly, the second conductive layer 224 only partially covers the bottom of the second opening 220. Subsequently, the N-well region 203 is lightly doped with P-type dopants to form a second P⁻ region 225 in the N-well 203 underneath the first opening 219. Similarly, the P-well region 204 is lightly doped with N-type dopants to form a second N⁻ region 226 in the P-well 204 underneath the second opening 220. The first P⁻ region 215 and the second P⁻ region serve as a PMOS drift region, while the first N⁻ region 216 and the second N⁻ region 226 serve as an NMOS drift region.

The following is a brief summary of the advantages in using the method of fabricating high-voltage MOS devices according to this invention.

According to one preferred embodiment of this invention, trenches 210 are used as isolating insulators instead of using field oxide layer in a conventional method. Furthermore, a vertical voltage drop structure rather than a planar structure is employed so that more area is available for forming a unit device and length of the drift region can be longer as shown in FIG. 2S. Therefore, this invention is capable of fabricating a CMOS transistor even at the sub-micron level, and hence is able to increase the level of circuit integration in a wafer.

In another aspect, since localized atomic oxygen implant and epitaxial growth techniques are used, etching stop can be precisely established in the silicon substrate of an active area. For example, as shown in FIG. 2O, the end point of a substrate etching operation inside the active area can be precisely controlled due to the presence of the second oxide layer 206.

Furthermore, the high-voltage MOS device fabricated according to this invention has a rather large operating current. Taking the NMOS shown in FIG. 2L as an example, when N⁻ dopants are being driven-in, some of the dopants in the N⁻ region 216 can be driven into the region underneath the MOS channel as well. Other regions are blocked by the second oxide layer 206, thereby ensuring purity of ions outside the N⁻ region. Consequently, the operating current of the NMOS device can be increased. Similarly, as shown in FIG. 2L, taking the PMOS as an example, when P⁻ dopants are being driven-in, some of the dopants in the P⁻ region 215 can be driven into the region underneath the MOS channel as well. Other regions are blocked by the second oxide layer 206, thereby ensuring purity of ions in non-P⁻ region. Consequently, operating current of the PMOS device can be increased.

In addition, according to one preferred embodiment of this invention, markings that define the location of the trench isolating insulators are formed prior to the formation of the epitaxial layer. These markings can serve as alignment labels after the epitaxial layer is formed following the current trend in semiconductor fabrication.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a high-voltage metal-oxide-semiconductor (MOS) device, the method comprising the steps of:

providing a semiconductor substrate, and then sequentially forming a first oxide layer and a first silicon nitride layer over the semiconductor substrate;

forming isolating insulators by etching away a portion of the first silicon nitride layer;

forming an N-well and a P-well between the isolating insulators;

performing a localized oxygen ion implant, implanting atomic oxygen into a portion of the N-well and the P-well, and then carrying out an annealing and oxidizing operation to form a second oxide layer in the N-well and the P-well, wherein the second oxide layer is buried within the N-well and the P-well;

removing the first silicon nitride layer and the first oxide layer;

forming an epitaxial silicon layer over the semiconductor substrate;

forming a third oxide layer and a second silicon nitride layer above the epitaxial silicon layer;

etching away a portion of the second silicon nitride layer, the third oxide layer, the N-well and the P-well, thereby forming a trench between the N-well and the P-well;

forming a fourth oxide layer covering the trench surface, and then depositing a fifth oxide layer into the trench;

removing the second silicon nitride layer and the third oxide layer;

forming a sixth oxide layer over the semiconductor substrate;

forming a first P⁻ region in the N-well and forming a first N⁻ region in the P-well, wherein depth of the first P⁻ region and depth of the first N⁻ region are at a level lower than the second oxide layer;

forming a P⁺ region in the N-well and forming an N⁺ region in the P-well, wherein depth of the P⁺ region and depth of the N⁺ region are at a level higher than the second oxide layer;

patterning out an active area by etching a portion of the sixth oxide layer;

etching away a portion of the P⁺ region and the first P⁻ region in the N-well to form a first opening, wherein etching stops at the second oxide layer, and etching away a portion of the N⁺ region and the first N⁻ region in the P-well to form a second opening, wherein etching stops at the second oxide layer;

removing the sixth oxide layer and the second oxide layer;

forming a seventh oxide layer over the semiconductor substrate;

performing a PMOS punchthrough implant and a threshold voltage implant with respect to the N-well;

performing an NMOS punchthrough implant and a threshold voltage implant with respect to the P-well;

removing the seventh oxide layer;

forming a gate oxide layer over the semiconductor substrate;

forming a first conductive layer over the gate oxide layer at the bottom of the first opening within the N-well, and forming a second conductive layer over the gate oxide layer at the bottom of the second opening within the P-well;

lightly doping P-type dopants into the N-well region to form a second P⁻ region in the N-well underneath the first opening; and lightly doping N-type dopants into the P-well region to form a second N⁻ region in the P-well underneath the second opening.

2. The method of claim 1, wherein the step of forming the isolating insulators includes first constructing a photomask using a photolithographic operation, and then using the photomask as a mask for etching the first silicon nitride layer.

3. The method of claim 1, wherein the step of forming the N-well and the P-well further includes implanting N-type dopants into a region intended to be the N-well and implanting P-type dopants into a region intended to be the P-well, and then driving in the dopants by heating.

4. The method of claim 1, wherein the step of performing the localized oxygen ion implant includes constructing a photomask for patterning the active area using a photolithographic operation first, and then using the photomask as a mask to carry out the localized oxygen ion implant.

5. The method of claim 1, wherein the step of forming an epitaxial silicon layer over the semiconductor substrate above the N-well and P-well includes using epitaxial growth techniques.

6. The method of claim 1, wherein the step of forming the trench between the N-well and the P-well includes using the same photomask for forming isolating insulators as a mask to etch away a portion of the second silicon nitride layer, the third oxide layer, the N-well and the P-well, using a dry etching method.

7. The method of claim 1, wherein the step of depositing the fifth oxide layer into the trench includes a high-density plasma chemical vapor deposition method.

8. The method of claim 1, wherein the first P⁻ region includes a lightly doped P-type region and the first N⁻ region includes a lightly doped N-type region.

9. The method of claim 1 wherein the step of forming the first P⁻ region and the first N⁻ region further includes implanting a low concentration of P-type dopants into the N-well and implanting a low concentration of N-type dopants into the P-well, and then heating the substrate to drive the dopants into the substrate to a depth lower than the second oxide layer.

10. The method of claim 1, wherein the P⁺ region includes a heavily doped P-type region and the N region includes a heavily doped N-type region.

11. The method of claim 1, wherein the step of forming the P⁺ region and the N⁺ region further includes implanting a high concentration of P-type dopants into the N-well and implanting a high concentration of N-type dopants into the P-well, and then heating the substrate to drive the dopants into the substrate interior.

12. The method of claim 1, wherein the step of patterning the active area includes using the same photomask used in the localized oxygen ion implant as a mask to etch the sixth oxide layer.

13. The method of claim 1, wherein the mask for forming the first opening and the second opening and the mask for patterning out the active area through etching away a portion of the sixth oxide layer are the same.

14. The method of claim 1, wherein the step of performing the N-well's PMOS punchthrough implant and the threshold voltage implant includes using $P^{31}$ and $BF_2$, respectively.

15. The method of claim 1, wherein the step of performing P-well's NMOS punchthrough implant and threshold voltage implant includes using $B^{11}$ and $BF_2$, respectively.

16. The method of claim 1, wherein the step of forming the first conductive layer and the second conductive layer includes depositing doped polysilicon.

17. The method of claim 1, wherein the step of forming the first conductive layer and the second conductive layer further includes depositing polysilicon over the gate oxide layer at the bottom of the first opening and the second opening at the same time, then doping the polysilicon layer, and finally patterning the polysilicon layer.

18. The method of claim 1, wherein the first conductive layer covers the bottom part of the first opening only partially, and the second conductive layer also covers the bottom part of the second opening only partially.

19. A method of manufacturing a high-voltage metal-oxide-semiconductor (MOS) device, the method comprising the steps of providing a semiconductor substrate, and then sequentially forming a first oxide layer and a first silicon nitride layer over the semiconductor substrate;

forming isolating insulators by etching away a portion of the first silicon nitride layer;

forming an N-well between the isolating insulators;

performing a localized oxygen ion implant, implanting atomic oxygen into a portion of the N-well, and then carrying out an annealing and oxidizing operation to form a second oxide layer in the N-well, wherein the second oxide layer is buried within the N-well;

removing the first silicon nitride layer and the first oxide layer;

forming an epitaxial silicon layer over the semiconductor substrate;

forming a third oxide layer and a second silicon nitride layer above the epitaxial silicon layer;

etching away a portion of the second silicon nitride layer, the third oxide layer and the N-well, thereby forming a trench between the N-wells;

forming a fourth oxide layer covering the trench surface, and then depositing a fifth oxide layer into the trench;

removing the second silicon nitride layer and the third oxide layer;

forming a sixth oxide layer over the semiconductor substrate;

forming a first P⁻ region in the N-well, wherein depth of the first P⁻ region is at a level lower than the second oxide layer;

forming a P⁺ region in the N-well, wherein depth of the P⁺ region is at a level higher than the second oxide layer;

patterning out an active area by etching away a portion of the sixth oxide layer;

etching away a portion of the P⁺ region and the first P⁻ region in the N-well to form an opening, wherein etching stops at the second oxide layer;

removing the sixth oxide layer and the second oxide layer;

forming a seventh oxide layer over the semiconductor substrate;

performing a PMOS punchthrough implant and a threshold voltage implant with respect to the N-well;

removing the seventh oxide layer;

forming a gate oxide layer over the semiconductor substrate;

forming a conductive layer over the gate oxide layer at the bottom of the opening within the N-well; and lightly doping P-type dopants into the N-well region to form a second P⁻ region in the N-well underneath the opening.

20. The method of claim 19, wherein the step of forming the isolating insulators includes first constructing a photomask using a photolithographic operation, and then using the photomask as a mask for etching the first silicon nitride layer.

21. The method of claim 19, wherein the step of forming the N-well further includes implanting N-type dopants into a region intended to be the N-well, and then driving-in the dopants by heating.

22. The method of claim 19, wherein the step of performing the localized oxygen ion implant includes constructing a photomask for patterning the active area using a photolithographic operation first, and then using the photomask as a mask to carry out the localized oxygen ion implant.

23. The method of claim 19, wherein the step of forming an epitaxial silicon layer over the semiconductor substrate above the N-well includes using epitaxial growth techniques.

24. The method of claim 19, wherein the step of forming the trench between the N-wells includes using the photomask, used to form isolating insulators as a mask to etch away a portion of the second silicon nitride layer, the third oxide layer and the N-well using a dry etching method.

25. The method of claim 19 wherein the step of depositing the fifth oxide layer into the trench includes a high-density plasma chemical vapor deposition method.

26. The method of claim 19, wherein the first P⁻ region includes a lightly doped P-type region.

27. The method of claim 19, wherein the step of forming the first P⁻ region further includes implanting a low concentration of P-type dopants into the N-well, and then heating the substrate to drive the dopants into the substrate to a depth lower than the second oxide layer.

28. The method of claim 19, wherein the P⁺ region includes a heavily doped P-type region.

29. The method of claim 19, wherein the step of forming the P⁺ region further includes implanting a high concentration P-type dopants into the N-well, and then heating the substrate to drive the dopants into the substrate interior.

30. The method of claim 19, wherein the step of patterning the active area includes using the same photomask used in the localized oxygen ion implant as a mask to etch the sixth oxide layer.

31. The method of claim 19, wherein the mask for forming the opening and the mask for patterning out the active area through etching away a portion of the sixth oxide layer are the same.

32. The method of claim 19, wherein the step of performing the N-well's PMOS punchthrough implant and threshold voltage implant includes using $P^{31}$ and $BF_2$, respectively.

33. The method of claim 19, wherein the step of forming the conductive layer and the second conductive layer includes depositing doped polysilicon.

34. The method of claim 19, wherein the step of forming the conductive layer further includes depositing polysilicon over the gate oxide layer at the bottom of the opening, then doping the polysilicon layer, and finally patterning the polysilicon layer.

35. The method of claim 19, wherein the conductive layer only partially covers the bottom part of the opening.

36. A method of manufacturing a high-voltage metal-oxide-semiconductor (MOS) device, the method comprising the steps of:

providing a semiconductor substrate, and then sequentially forming a first oxide layer and a first silicon nitride layer over the semiconductor substrate;

forming a pattern of isolating insulators by etching away a portion of the first silicon nitride layer;

forming a P-well between the isolating insulators;

performing a localized oxygen ion implant, implanting atomic oxygen into a portion of the P-well, and then carrying out an annealing and oxidizing operation to form a second oxide layer in the P-well, wherein the second oxide layer is buried within the P-well;

removing the first silicon nitride layer and the first oxide layer;

forming an epitaxial silicon layer over the semiconductor substrate;

forming a third oxide layer and a second silicon nitride layer above the epitaxial silicon layer;

etching away a portion of the second silicon nitride layer, the third oxide layer and the P-well, thereby forming a trench between the P-wells;

forming a fourth oxide layer covering the trench surface, and then depositing a fifth oxide layer into the trench;

removing the second silicon nitride layer and the third oxide layer;

forming a sixth oxide layer over the semiconductor substrate;

forming a first N⁻ region in the P-well, wherein depth of the first N⁻ region is at a level lower than the second oxide layer;

forming a N⁺ region in the P-well, wherein depth of the N⁺ region is at a level higher than the second oxide layer;

patterning out an active area through etching away a portion of the sixth oxide layer;

etching away a portion of the N⁺ region and the first N⁻ region in the P-well to form an opening, wherein etching stops at the second oxide layer;

removing the sixth oxide layer and the second oxide layer;

forming a seventh oxide layer over the semiconductor substrate;

performing a NMOS punchthrough implant and a threshold voltage implant with respect to the P-well;

removing the seventh oxide layer;

forming a gate oxide layer over the semiconductor substrate;

forming a conductive layer over the gate oxide layer at the bottom of the opening within the P-well; and lightly doping N-type dopants into the P-well region to form a second N⁻ region in the P-well underneath the opening.

37. The method of claim 36, wherein the step of forming the isolating insulators includes first constructing a photomask using a photolithographic operation, and then using the photomask as a mask for etching the first silicon nitride layer.

38. The method of claim 36, wherein the step of forming the P-well further includes implanting P-type dopants into a region intended to be the P-well, and then driving-in the dopants by heating.

39. The method of claim 36, wherein the step of performing the localized oxygen ion implant includes constructing a photomask for patterning the active area using a photolithographic operation first, and then using the photomask as a mask to carry out the localized oxygen ion implant.

40. The method of claim 36, wherein the step of forming an epitaxial silicon layer over the semiconductor substrate above the P-well includes using epitaxial growth techniques.

41. The method of claim 36, wherein the step of forming the trench between the P-wells includes using the same photomask for forming a pattern of isolating insulators as a mask to etch away a portion of the second silicon nitride layer, the third oxide layer and the P-well using a dry etching method.

42. The method of claim 36, wherein the step of depositing the fifth oxide layer into the trench includes a high-density plasma chemical vapor deposition method.

43. The method of claim 36, wherein the first $N^-$ region includes a lightly doped N-type region.

44. The method of claim 36, wherein the step of forming the first $N^-$ region further includes implanting a low concentration of N-type dopants into the P-well, and then heating the substrate to drive the dopants into the substrate to a depth lower than the second oxide layer.

45. The method of claim 36, wherein the $N^+$ region includes a heavily doped N-type region.

46. The method of claim 36, wherein the step of forming the $N^+$ region further includes implanting a high concentration of N-type dopants into the P-well, and then heating the substrate to drive the dopants into the substrate interior.

47. The method of claim 36, wherein the step of patterning the active area includes using the same photomask used in the localized oxygen ion implantation as a mask to etch the sixth oxide layer.

48. The method of claim 36, wherein the mask for forming the opening and the mask for patterning out the active area by etching away a portion of the sixth oxide layer are the same.

49. The method of claim 36, wherein the step of performing the P-well's NMOS punchthrough implant and threshold voltage implant includes using $B^{11}$ and $BF_2$, respectively.

50. The method of claim 36, wherein the step of forming the conductive layer and the second conductive layer includes depositing doped polysilicon.

51. The method of claim 36, wherein the step of forming the conductive layer further includes depositing polysilicon over the gate oxide layer at the bottom of the opening, then doping the polysilicon layer, and finally patterning the polysilicon layer.

52. The method of claim 36, wherein the conductive layer only partially covers the bottom part of the opening.

* * * * *